(12) United States Patent
Yamada et al.

(10) Patent No.: US 12,532,767 B2
(45) Date of Patent: Jan. 20, 2026

(54) AL BONDING WIRE

(71) Applicants: NIPPON MICROMETAL CORPORATION, Saitama (JP); NIPPON STEEL Chemical & Material Co., Ltd., Tokyo (JP)

(72) Inventors: Takashi Yamada, Saitama (JP); Akihito Nishibayashi, Saitama (JP); Teruo Haibara, Saitama (JP); Daizo Oda, Saitama (JP); Motoki Eto, Saitama (JP); Tetsuya Oyamada, Tokyo (JP); Takayuki Kobayashi, Tokyo (JP); Tomohiro Uno, Tokyo (JP)

(73) Assignees: NIPPON MICROMETAL CORPORATION, Saitama (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 648 days.

(21) Appl. No.: 17/911,090

(22) PCT Filed: Mar. 13, 2020

(86) PCT No.: PCT/JP2020/011243
§ 371 (c)(1),
(2) Date: Sep. 12, 2022

(87) PCT Pub. No.: WO2021/181697
PCT Pub. Date: Sep. 16, 2021

(65) Prior Publication Data
US 2023/0146315 A1 May 11, 2023

(51) Int. Cl.
*H01L 23/00* (2006.01)

(52) U.S. Cl.
CPC .... *H01L 24/45* (2013.01); *H01L 2224/45005* (2013.01); *H01L 2224/45124* (2013.01); *H01L 2924/01021* (2013.01); *H01L 2924/01039* (2013.01); *H01L 2924/01057* (2013.01); *H01L 2924/01058* (2013.01); *H01L 2924/01059* (2013.01); *H01L 2924/0106* (2013.01)

(58) Field of Classification Search
CPC ...................... H01L 2224/45124; H01L 24/45
See application file for complete search history.

(56) References Cited

U.S. PATENT DOCUMENTS

| | | | |
|---|---|---|---|
| 9,312,235 B1 | 4/2016 | Kang et al. | |
| 2015/0303165 A1 | 10/2015 | Milke et al. | |
| 2017/0200689 A1 | 7/2017 | Yamada et al. | |

FOREIGN PATENT DOCUMENTS

| | | | | |
|---|---|---|---|---|
| CN | 101380703 B | * | 9/2011 | |
| CN | 102409198 A | | 4/2012 | |
| CN | 103276255 A | | 9/2013 | |
| CN | 105970035 A | | 9/2016 | |
| CN | 106238952 A | | 12/2016 | |
| CN | 106553008 A | | 4/2017 | |
| CN | 106636780 B | | 4/2018 | |
| CN | 108292612 A | | 7/2018 | |
| CN | 108754262 A | | 11/2018 | |
| EP | 3382747 A1 | | 10/2018 | |
| JP | H07-316705 A | | 12/1995 | |
| JP | H08-291348 A | | 11/1996 | |
| JP | H09-272931 A | | 10/1997 | |
| JP | 2001-348637 A | | 12/2001 | |
| JP | 2002-314038 A | | 10/2002 | |
| JP | 2002-359261 A | | 12/2002 | |
| JP | 2004-228541 A | | 8/2004 | |
| JP | 2007-123597 A | | 5/2007 | |
| JP | 2008-218994 A | | 9/2008 | |
| JP | 2013258324 A | * | 12/2013 | ............. H01L 24/43 |
| JP | 2014-047417 A | | 3/2014 | |
| JP | 2016-511529 A | | 4/2016 | |
| JP | 2016108612 A | * | 6/2016 | |
| TW | 201920701 A | | 6/2019 | |

OTHER PUBLICATIONS

Extended European Search Report issued for the corresponding European patent Application No. 20924290.8 on Nov. 20, 2023.
Search Report and Written Opinion received in corresponding Singapore Patent Application No. 11202252979T, dated Mar. 10, 2025.
International Search Report issued in corresponding International Patent Application No. PCT/JP2020/011243, filed Apr. 14, 2020, with English translation.
Written Decision on Registration issued on Oct. 29, 2024, in corresponding Korean Patent Application No. 10-2022-7030950, 8 pages.
Taiwanese Office Action issued in Taiwanese Patent Application No. 109109139, dated Aug. 9, 2023, with English translation.
Taiwanese Office Action issued in corresponding Taiwanese Application No. 109110799, dated Aug. 4, 2023 with English translation.
Office Action received in corresponding Chinese Patent Application No. 202080098398.0, dated Apr. 8, 2025, w/ English Translation.
Second Office Action issued in corresponding Chinese Patent Application No. 202080098398.0, dated Aug. 15, 2025.

* cited by examiner

Primary Examiner — Yu-Hsi D Sun
(74) Attorney, Agent, or Firm — Rimon P.C.

(57) ABSTRACT

There is provided an Al bonding wire which can achieve a sufficient bonding reliability of bonded parts of the bonding wire under a high temperature state where a semiconductor device using the Al bonding wire is operated. The Al bonding wire contains 0.01 to 1% of Sc, and further contains 0.01 to 0.1% in total of at least one or more of Y, La, Ce, Pr and Nd. With regard to the Al bonding wire, a recrystallization temperature thereof is increased, so that the proceeding of recrystallization of the bonding wire can be suppressed, and strength of the wire can be prevented from being decreased even when the semiconductor device is continuously used under a high temperature environment. Accordingly, the Al bonding wire can sufficiently secure the reliability of the bonded parts after a high-temperature long-term hysteresis.

5 Claims, No Drawings

AL BONDING WIRE

CROSS-REFERENCE OF RELATED APPLICATIONS

This application is the U.S. National Phase under 35 U.S.C. § 371 of International Patent Application No. PCT/JP2020/011243, filed on Mar. 13, 2020, the entire disclosure of which Application is incorporated by reference herein.

TECHNICAL FIELD

The present invention relates to an Al bonding wire.

BACKGROUND ART

In a semiconductor device, electrodes formed on a semiconductor element are connected with lead frames or electrodes on a substrate using a bonding wire. As for a material of the bonding wire, gold (Au) and copper (Cu) are used for an integrated circuit semiconductor device such as an ultra-LSI, while aluminum (Al) is mainly used for a power semiconductor device. For example, Patent Literature 1 discloses an example in which an aluminum bonding wire (hereinafter referred to as an "Al bonding wire") with a diameter of 300 μm is used in a power semiconductor module. In a power semiconductor device using an Al bonding wire, a wedge bonding is used as a bonding process for both of the connection with electrodes on semiconductor element and the connection with lead frames or electrodes on substrate.

A power semiconductor device using an Al bonding wire is often used as a semiconductor device for large power equipment such as air conditioner and photovoltaic power generation system, and for automotive. In these semiconductor devices, the bonded parts of Al bonding wire are exposed to high temperatures of 100 to 300° C. Since an Al bonding wire composed only of high purity Al tends to soften in such a high temperature environment, it is difficult to use such Al bonding wire in a high temperature environment.

When an alloy of containing scandium (Sc) (hereinafter, referred to as "Sc") is used and Sc is precipitated as $Al_3Sc$ the strength of the Al bonding wire can be increased. Patent Literature 2 discloses a bonding wire containing Al as a principal component and 0.05 to 1.0% of Sc. It discloses that, by precipitating $Al_3Sc$ in the bonding wire, an optimum combination of electrical and mechanical characteristics is obtained.

However, when the bonding wire in which. $Al_3Sc$ is precipitated is used for bonding to the electrode on the semiconductor element, the mechanical strength of the wire is high, and thus a chip crack of the semiconductor element is caused, and the bonding wire cannot be put into practical use. On the other hand, Patent Literature 3 discloses the invention in which Sc is contained to an Al bonding wire, $Al_3Sc$ is not precipitated by a prior solution treatment in the bonding wire before bonding, and $Al_3Sc$ is precipitated by an aging heat treatment that is performed after bonding. In the invention, the wire is softened at a bonding stage since $Al_3Sc$ is not precipitated, and a chip crack is not caused at the time of bonding. On the other hand, $Al_3Sc$ is precipitated by performing the aging heat treatment after bonding, and thus the strength of the wire is increased and the wire can keep sufficient strength even when the semiconductor device is used under a high temperature environment.

RELATED ART REFERENCE

Patent Literature

Patent Literature 1: JP-A-2002-314038
Patent Literature 2: JP-T-2016-511529
Patent Literature 3: JP-A-2014-47417

SUMMARY OF INVENTION

Problem to be Solved by the Invention

Even for the semiconductor device using the Al bonding wire containing Sc as described in Patent Literature 3, sufficient bonding reliability of the bonded parts of the bonding wire was sometimes not achieved under a high temperature state where the semiconductor device was operated.

An object of the present invention is to provide an Al bonding wire which achieves sufficient bonding reliability of bonded parts of the bonding wire under a high temperature state where a semiconductor device using the Al bonding wire is operated.

Means for Solving Problem

For the Al bonding wire containing Sc, the strength of the bonding wire can be increased by performing the aging heat treatment after bonding to precipitate $Al_3Sc$, as described in Patent Literature 3. However, it has been found that when the semiconductor device is continuously used under a high temperature environment, recrystallization of the Al bonding wire further proceeds, and the strength of the wire is decreased as a result.

On the other hand, it has been found that, when the Al bonding wire containing 0.01 to 1% of Sc further contains 0.01 to 0.1% in total of at least one or more of yttrium, lanthanum, cerium, praseodymium and neodymium (hereinafter, referred to as "Y, La, Ce, Pr and Nd") in addition to Sc, the recrystallization temperature of the wire is increased, so that the proceeding of recrystallization of the bonding wire can be suppressed, and the strength of the wire can be prevented from being decreased even when the semiconductor device is continuously used under the high temperature environment.

The present invention is made based on the findings described above, and the summary thereof is as follows.

[1] An Al bonding wire comprising 0.01 to 1% by mass of Sc and further 0.01 to 0.1% by mass in total of at least one or more of Y, La, Ce, Pr and Nd, with the balance comprising Al and inevitable impurities.

[2] The Al bonding wire according to [1], wherein an average crystal grain size in a cross-section perpendicular to a wire longitudinal direction is 0.1 to 50 μm.

[3] The Al bonding wire according to [1] or [2], wherein in a cross-section perpendicular to a wire longitudinal direction, an area ratio of a crystal having a crystal orientation <111> angled at 15 degrees or less to a wire longitudinal direct on is 30 to 90%.

[4] The Al bonding wire according to any one of [1] to [3], wherein the Vickers hardness of the wire falls within a range from Hv20 to 40.

[5] The Al bonding wire according to any one of [1] to [4], wherein a wire diameter is 50 to 600 μm.

Effect of the Invention

The Al bonding wire of the present invention contains 0.01 to 1% of Sc, and further contains 0.01 to 0.1% in total of at least one or more of Y, La, Ce, Pr and Nd. As for the Al bonding wire of the present invention, the recrystallization temperature of the wire is increased, so that the proceeding of recrystallization of the bonding wire can be suppressed, and the strength of the wire can be prevented from being decreased even when the semiconductor device, is continuously used under the high temperature environment. Accordingly, the Al bonding wire can sufficiently secure the reliability of the bonded parts after a high-temperature and long-term hysteresis.

EMBODIMENT FOR CARRYING OUT THE INVENTION

Regarding an Al bonding wire containing Sc, when Sc is enforced to form a solid solution by the prior solution treatment and $Al_3Sc$ is not precipitated, the wire is softened at a bonding stage, and a chip crack is not caused at the time of bonding, as described in Patent Literature 3. Further, as a result of precipitating $Al_3Sc$ by performing the aging heat treatment after bonding, the strength of the wire is increased and the recrystallization temperature is increased, so that the recrystallization is prevented from proceeding during use at a high temperature and the wire strength can be maintained.

However, as described above, even for the semiconductor device including the Al bonding wire in which Sc is precipitated, when the semiconductor device is operated for a long time under a high temperature state, there was observed a phenomenon in which the bonding strength of bonded parts of the bonding wire decreased. In other words, it was found that sufficient bonding reliability cannot be achieved. According to the observation of the cross-section of the bonding wire the semiconductor device after long-term operation under a high temperature, it was found that the crystal grain size of the wire is increased as compared with that at the time of bonding. It is therefore inferred that the recrystallization of the wire has further proceeded due to long-term operation under a high temperature, resulting in a decrease in the wire strength and the reliability of the bonded parts.

In contrast, the Al bonding wire of the present invention is characterized by further containing 0.01 to 0.1% in total of at least one or more of Y, La, Ce, Pr and Nd (hereinafter, also simply referred to as "Y, La, and the like") in addition to 0.01 to 1% of Sc. Thus, the recrystallization temperature of the wire is increased, so that even when the semiconductor device is continuously operated for a long time under a high temperature environment, the proceeding of recrystallization of the bonding wire can be sufficiently suppressed and the strength of the wire can be prevented from being decreased. A detailed description will next be given.

The Al bonding wire according to the present invention contains 0.01 to 1% by mass of Sc and further 0.01 to 0.1% by mass in total of at least one or more of Y, La, Ce, Pr and Nd, and the balance includes Al and inevitable impurities. A material having such composition is subjected to wire-drawing processing to form a bonding wire having a predetermined wire diameter. Before the wire-drawing processing, in the middle of the wire-drawing processing, or after the wire-drawing processing end, the solution heat treatment is preferably performed such that Sc, Y, La, and the like are enforced to form solid solution. A condition for the solution heat treatment is preferably 1 to 3 hours at 570 to 640° C.

After the wire-drawing processing end, and if the solution heat treatment described above is performed, at the following stage, a thermal refining heat treatment for softening the wire is performed. The thermal refining heat treatment may be additionally performed in the middle of the wire-drawing processing. A crystal structure of the wire is changed from a processed structure to a recrystallized structure by the thermal refining heat treatment. Thus, the crystal structure is changed to the recrystallized structure, so that softening of the wire can be achieved. A condition for the thermal refining heat treatment is preferably 5 to 15 seconds at 250 to 300° C. Thus, the crystal structure can be changed to the recrystallized structure without precipitating Sc, Y, La, and the like which have been formed a solid solution.

In the present invention, preferably, by performing the solution treatment in a manufacturing process of the wire as described above, Sc, Y, La, and the like are not precipitated in the wire. In a case where the solution heat treatment is not performed, precipitates such as Sc, Y, La, and the like are precipitated in the wire, so that Vickers hardness of the wire exceeds Hv40. In contrast, as a result of performing the solution heat treatment and the thermal refining heat treatment, Sc, Y, La, and the like are enforced to form a solid solution, and the crystal structure becomes the recrystallized structure, so that the Vickers hardness of the wire becomes Hv40 or less and the wire is softened. By bonding to a semiconductor electrode with using the Al bonding wire of the present invention that is softened as described above, a chip crack of the semiconductor electrode is prevented from being caused.

After bonding, the aging heat treatment is performed on the semiconductor device including the bonding wire so as to precipitate Sc, Y, La, and the like in the bonding wire. As a result of the aging heat treatment, Sc, Y, La, and the like in the bonding wire are precipitated. Se is precipitated as $Al_3Sc$, Y is precipitated as $Al_3Y$, La is precipitated as $Al_{11}La_3$, Ce is precipitated as $Al_{11}Ce_3$, Pr is precipitated as $Al_{11}Pr_3$, and Nd is precipitated as $Al_{11}Nd_3$. As a result of the fact that these precipitates are formed in the wire, the wire is precipitation-strengthened, and the strength of the wire is increased. A condition for the aging heat treatment is preferably 30 to 60 minutes at 250 to 400° C.

Immediately after the aging heat treatment, and after being subjected to a high-temperature and long-term hysteresis under a condition that is not so severe, the mechanical strength can be maintained and the reliability of bonded parts of the bonding wire with the electrode of the semiconductor device is sufficiently maintained in both of the Al bonding wire containing only Sc and the Al bonding wire containing Sc, Y, La, and the like, because precipitation-hardening due to precipitates can be obtained and excessive recrystallization is not caused. However, it has been found that, in a more severe environment, specifically, when the wire is held in an environment of a higher temperature and a longer time, the reliability of bonded parts of the Al bonding w re containing only Sc deteriorated. In contrast, it has been found that the Al bonding wire of the present invention which contains Y, La, and the like in addition to Sc can secure the reliability of bonded parts even after the Al bonding wire is subjected to such a severer environment.

There be described an evaluation test of reliability of the bonded parts after a high-temperature long-term hysteresis.

As a bonding wire, an Al bonding wire of a comparative example that contains only 0.5% by mass of Sc, and an Al bonding wire of the present invention that contains 0.5% of Sc and 0.1% of Y were used. The wire diameter after wire-drawing was 200 μm. In the middle of the wire-drawing processing, the solution heat treatment was performed such that Sc and Y were enforced to form a solid solution, and the thermal refining heat treatment was performed on the wire after wire-drawing to adjust the Vickers hardness of the bonding wire to be Hv40 or less.

In the semiconductor device, both the first bonded part between the semiconductor chip and the bonding wire and the second bonded part between the external terminal and the bonding wire utilized wedge bonding.

The high-temperature long-term hysteresis was performed by power cycle test. The power cycle test involves repeatedly heating and cooling the semiconductor device in which the Al bonding wires are bonded. Specifically, the semiconductor device is heated over 2 seconds until the temperature of the bonded parts of the bonding wires in the semiconductor device becomes 140° C., and then is cooled over 5 seconds until the temperature of the bonded parts becomes 30° C. This heating and cooling cycle is repeated 200,000 times.

After performing the high-temperature long-term hysteresis as noted above, the bond shear force of the first bonded part was measured to evaluate the reliability of the bonded parts. As a result, regarding the Al bonding wire only containing 0.5% by mass of Sc, the bond shear force was less than 50% compared to the initial shear force, and the reliability of the bonded parts was insufficient. In contrast, regarding the Al bonding wire of the present invention containing 0.5% of Sc and 0.1% of Y, the bond shear force was 90% or more compared to the initial shear force, so that the sufficient reliability of the bonded parts could be ensured.

There will be described the composition of the bonding wire of the present invention. In the description, "%" means "% by mass".

<<0.01 to 1% of Sc>>

When the Al bonding wire contains 0.01% or more of Sc, an effect of precipitation-strengthening the wire and an effect of preventing recrystallization from proceeding during use of the semiconductor device at a high temperature for a long time can be achieved, in combination with a composite additive effect with Y, La, and the like described below. The content of Sc is more preferably 0.1% or more, more preferably 0.3% or more, and further preferably 0.5% or more. On the other hand, if the content of Sc exceeds 1%, the hardness of the wire becomes too high, so that a chip crack is caused, a bonding quality is deteriorated, and the reliability of the bonded parts is deteriorated, for example. Thus, an upper limit of the content of Sc is set to be 1%. The content of Sc is more preferably 0.8% or less.

<<0.01 to 0.1% in Total of at Least One or More of Y, La, Ce, Pr and Nd>>

When the Al bonding wire contains 0.01% or more in total of at least one or more of Y, La, Ce, Pr and Nd (Y, La, and the like), the effect of precipitation-strengthening the wire and the effect of preventing recrystallization from proceeding during use of the semiconductor device at a high temperature for a long time can be achieved, in combination with the composite additive effect with Sc as described above. Any of Y, La, Ce, Pr and Nd achieves the same effects. The total content of Y, La, and the like is more preferably 0.03% or more, further preferably 0.05% or more. On the other hand, if the total content of Y, La, and the like exceeds 0.1%, the hardness of the wire becomes too high, so that a chip crack is caused, a bonding quality is deteriorated, and the reliability of the bonded parts is deteriorated, for example. Thus, an upper limit of the total content is set to be 0.1%. The total content of Y, La, and the like is more preferably 0.08% or less.

For analyzing the content of Sc or Y, La, and the like in the bonding wire, an ICP emission spectroscopic analysis device and an ICP mass spectroscopic device can be used. The contents of Sc, Y, La, and the like described in the present invention are based on concentration measured by ICP emission spectroscopic analysis or ICP mass spectroscopy.

The balance, the remaining part, of the bonding wire may consist of Al and inevitable impurities. Examples of elements of the inevitable impurities may include Si, Fe, and Cu. A total content of the inevitable impurities is preferably small because variation in material characteristics can be suppressed to be small. By using aluminum having a purity of 4N (Al: 99.99% or more) as an aluminum raw material for manufacturing the wire, a favorable result can be obtained.

<<Average Crystal Grain Diameter of Wire>>

In a preferable embodiment of the present invention, the average crystal grain size is 0.1 to 50 μm in the cross-section. (C cross-section) perpendicular to a wire longitudinal direction of the bonding wire. As for a measuring method of the average crystal grain size, a measuring method such as EBSD (Electron Back Scatter Diffraction Patterns) is used to determine the area of each crystal grain and then to calculate the average of diameter of each crystal grain on the supposition that each crystal grain is a circle. When the average crystal grain size is 0.1 μm or more, recrystallization by the thermal refining heat treatment at the time of wire-drawing has moderately proceeded, so that the wire is softened, in combination with the fact that components contained in the wire are enforced to form a solid solution by performing the solution heat treatment in the process of manufacturing the wire. Accordingly, a chip crack can be prevented from being caused at the time of bonding, and the bonding quality of the bonded parts can be prevented from being deteriorated, for example. On the other hand, if the average crystal grain size exceeds 50 μm, it indicates that recrystallization of the wire has excessively proceeded. Thus, even if precipitates are formed by the aging heat treatment, it is difficult to obtain sufficient strength, and as a result, the reliability of the bonded parts may be deteriorated. By performing the thermal refining heat treatment in the process of wire-drawing, the average crystal grain size the C cross-section of the wire can be 0.1 to 50 μm.

<<Area Ratio of Orientation <111> of Wire>>

In a preferable embodiment of the present invention, in the cross-section (C cross-section) perpendicular to the longitudinal direction of the bonding wire, an area ratio of a crystal having a crystal orientation <111> angled at 15 degrees or less to a wire longitudinal direction (hereinafter, referred to as "area ratio of orientation <111>") is 30 to 90%. For the measurement of the area ratio of orientation <111>, EBSD can be used. The area ratio of orientation <111> can be calculated by inspecting the cross-section perpendicular to the longitudinal direction of the bonding wire as an inspection surface, and using an analysis software dedicated to the measuring device. In the process of determining the area ratio of orientation <111>, there is excluded a portion where crystal orientation cannot be measured or a portion where the reliability of orientation analysis is low even when crystal orientation can be measured. When the area ratio of orientation <111> is 90% or less, recrystallization by the thermal refining heat treatment at the time of wire-drawing has moderately proceeded, so that the wire is softened, in combination with the fact that components contained in the wire are enforced to form a solid solution by performing the solution heat treatment in the process of manufacturing the wire. Accordingly, a chip crack can be prevented from being caused at the time of bonding, and the bonding quality of the bonded parts can be prevented from being deteriorated, for example. On the other hand, if the area ratio of orientation <111> is less than 30%, it indicates that recrystallization of the wire has excessively proceeded. Thus, even if precipitates are formed by the aging heat treatment, it is difficult to obtain sufficient strength, and as a result, the reliability of the bonded parts may be deteriorated. By performing the thermal refining heat treatment in the process of wire-drawing, the area ratio of orientation <111> in a cross-section perpendicular to the wire longitudinal direction can be 30 to 90%.

<<Vickers Hardness of Wire>>

In a preferable embodiment of the present invention, the Vickers hardness in the cross-section (C cross-section) perpendicular to the wire longitudinal direction of the bonding wire falls within a range from Hv20 to 40. When the Vickers hardness is Hv40 or less, a favorable bonding property can be achieved without generating a chip crack during bonding. In addition, loops can be easily formed to provide wiring to the semiconductor device. On the other hand, the Vickers hardness of less than Hv20 indicates that the recrystallization of the wire has excessively proceeded. Thus, even if precipitates are formed by the aging heat treatment, it is difficult to obtain sufficient strength, and as a result, the reliability of the bonded parts may be deteriorated. Therefore, the lower limit of the Vickers hardness is preferably Hv20. As described above, by performing the solution heat treatment in the process of manufacturing the wire such that the components contained in the wire are enforced to form a solid solution, and further performing the thermal refining heat treatment in the process of wire-drawing, the Vickers hardness of the wire can fall within the range from HV20 to 40.

<<Wire Diameter>>

In a preferable embodiment of the present invention, the diameter of the bonding wire is 50 to 600 µm. Wires with diameter of 50 µm or more are generally used for power system devices due to a large current flow. Wires with diameter exceeding 600 µm are difficult to handle and no wire bonders are available for them. Thus, wires with diameter of 600 µm or less are used.

EXAMPLES

Aluminum having a purity of 99.99 by mass or more (4N), and yttrium, lanthanum, cerium, praseodymium and neodymium having a purity of 99.9% by mass or more were molten as raw materials, and an Al alloy having a composition indicated in Tables 1 and 2 was obtained. This alloy was used as an ingot, the ingot was subjected to rolling with a groove roll, and was further subjected to wire-drawing processing. At a stage where the wire diameter was 800 µm, the wire was subjected to the solution heat treatment at 620° C. for 3 hours, and was rapidly cooled in water. Thereafter, the wire-drawing processing using dies was performed to achieve a final wire diameter of 200 µm. After the wire-drawing processing ended, the thermal refining heat treatment was performed at 270° C. for 10 seconds.

For the resultant wires, an average crystal grain size, an area ratio of a crystal having a crystal orientation <111> angled at 15 degrees or less to a wire longitudinal direction, and the Vickers hardness were measured on a cross-section (C cross-section) perpendicular to the wire longitudinal direction.

The average crystal grain size was measured by determining the area of each crystal grain using an EBSD method, converting the area of each crystal grain into the area of a circle, and averaging diameters of the converted circles.

The measurement of the area ratio of orientation. <111> was performed by measuring with EBSD on a cross-section perpendicular to the longitudinal direction of the bonding wire, and calculating the area ratio of orientation. <111> using the analysis software dedicated to the measuring device.

The Vickers hardness was measured as the hardness of the center position of the C cross-section in radial direction using a micro-Vickers hardness meter.

In the semiconductor device, the electrode on the semiconductor chip was Al—Cu, and the external terminal was Ag. Both the first bonded parts between the electrode on the semiconductor chip and the bonding wire and the second bonded parts between the external terminal and the bonding wire utilized wedge bonding.

After bonding, the aging heat treatment was performed at 350° C. for 45 minutes.

The bonding property of the bonding wire in the semiconductor device was evaluated by the presence or absence of initial bonding failure (before a high-temperature long-term hysteresis) of the first bonded parts. In the evaluation, a case being bonded was marked with a symbol of "circle", and a case being not bonded was marked with a symbol of "cross" in the column "bonding property" in Tables 1 and 2.

The evaluation of chip crack in the semiconductor device was performed by dissolving metal of the pad surface with an acid, and observing the presence or absence of chip cracks under the pad using a microscope. In the evaluation, no presence of cracks was marked with a symbol of "circle", some presence of cracks was marked with a symbol of "cross" in the column "chip crack" in Tables 1 and 2.

The high-temperature long-term hysteresis was performed by a power cycle test. The power cycle test involved repeatedly heating and cooling the semiconductor device in which an Al bonding wire had been bonded. Specifically, the semiconductor device was heated over 2 seconds until the temperature of the bonded parts of the bonding wires in the semiconductor device became 140° C., and then was cooled over 5 seconds until the temperature of the bonded parts became 30° C. This heating and cooling cycle was repeated 200,000 times.

After performing the high-temperature long-term hysteresis, the bond shear force of the first bonded part was measured to evaluate the reliability of the bonded part. The shear force was measured as a comparison with the initial shear force of the bonded part. In the evaluation, the shear force being 95% or more of the initial bond shear force was marked with a symbol of "double circle", being 90% or more and less than 95% of the initial bond shear force was marked with a symbol of "circle", being 50% or more and less than 90% of the initial bond shear force was marked with a symbol of "triangle", and being less than 50% of the initial bond shear force was marked with a symbol of "cross" in the column "reliability test" in Tables 1 and 2.

Manufacturing conditions and manufacturing results are shown in Tables 1 and 2. Y, La, Ce, Pr and Nd (Y, La, and the like) are indicated as "second components". In Table 2, underlined are values of component contents outside the range of the present invention and values of evaluation results outside the preferred range of the present invention.

TABLE 1

| | | Component content (% by mass) | | | | | | Wire properties | | | Performance in use | | |
|---|---|---|---|---|---|---|---|---|---|---|---|---|---|
| | | | Second components | | | | | Crystal grain size | Orientation (111) | Hardness | Bonding | Chip | Reliability |
| | No. | Sc | Y | La | Ce | Pr | Nd | Total | (µm) | (%) | Hv | property | crack | test |
| Working Example | 1 | 0.01 | 0.01 | 0 | 0 | 0 | 0 | 0.01 | 49 | 56 | 24 | ○ | ○ | ○ |
| | 2 | 0.01 | 0 | 0.01 | 0 | 0 | 0 | 0.01 | 43 | 57 | 29 | ○ | ○ | ○ |
| | 3 | 0.01 | 0 | 0 | 0.01 | 0 | 0 | 0.01 | 41 | 56 | 24 | ○ | ○ | ○ |
| | 4 | 0.01 | 0 | 0 | 0 | 0.01 | 0 | 0.01 | 45 | 56 | 24 | ○ | ○ | ○ |
| | 5 | 0.01 | 0 | 0 | 0 | 0 | 0.01 | 0.01 | 45 | 59 | 26 | ○ | ○ | ○ |
| | 6 | 0.01 | 0.1 | 0 | 0 | 0 | 0 | 0.1 | 24 | 63 | 29 | ○ | ○ | ○ |
| | 7 | 0.01 | 0 | 0.1 | 0 | 0 | 0 | 0.1 | 24 | 67 | 28 | ○ | ○ | ○ |
| | 8 | 0.01 | 0 | 0 | 0.1 | 0 | 0 | 0.1 | 21 | 66 | 32 | ○ | ○ | ○ |
| | 9 | 0.01 | 0 | 0 | 0 | 0.1 | 0 | 0.1 | 23 | 66 | 30 | ○ | ○ | ○ |
| | 10 | 0.01 | 0 | 0 | 0 | 0 | 0.1 | 0.1 | 29 | 65 | 29 | ○ | ○ | ○ |
| | 11 | 0.01 | 0.01 | 0.01 | 0 | 0 | 0 | 0.02 | 32 | 59 | 26 | ○ | ○ | ○ |
| | 12 | 0.01 | 0.01 | 0 | 0.01 | 0 | 0 | 0.02 | 36 | 58 | 28 | ○ | ○ | ○ |
| | 13 | 0.01 | 0.01 | 0 | 0 | 0.01 | 0 | 0.02 | 35 | 58 | 27 | ○ | ○ | ○ |
| | 14 | 0.01 | 0.01 | 0 | 0 | 0 | 0.01 | 0.02 | 36 | 61 | 29 | ○ | ○ | ○ |
| | 15 | 0.01 | 0.05 | 0.05 | 0 | 0 | 0 | 0.1 | 20 | 69 | 29 | ○ | ○ | ○ |
| | 16 | 0.01 | 0.05 | 0 | 0.05 | 0 | 0 | 0.1 | 22 | 65 | 27 | ○ | ○ | ○ |
| | 17 | 0.01 | 0.05 | 0 | 0 | 0.05 | 0 | 0.1 | 22 | 70 | 27 | ○ | ○ | ○ |
| | 18 | 0.01 | 0.05 | 0 | 0 | 0 | 0.05 | 0.1 | 25 | 68 | 27 | ○ | ○ | ○ |
| | 19 | 0.5 | 0.01 | 0 | 0 | 0 | 0 | 0.01 | 14 | 72 | 26 | ○ | ○ | ◎ |
| | 20 | 0.5 | 0 | 0.01 | 0 | 0 | 0 | 0.01 | 10 | 71 | 29 | ○ | ○ | ◎ |
| | 21 | 0.5 | 0 | 0 | 0.01 | 0 | 0 | 0.01 | 14 | 70 | 27 | ○ | ○ | ◎ |
| | 22 | 0.5 | 0 | 0 | 0 | 0.01 | 0 | 0.01 | 12 | 71 | 28 | ○ | ○ | ◎ |
| | 23 | 0.5 | 0 | 0 | 0 | 0 | 0.01 | 0.01 | 11 | 73 | 25 | ○ | ○ | ◎ |
| | 24 | 0.5 | 0.1 | 0 | 0 | 0 | 0 | 0.1 | 9 | 69 | 33 | ○ | ○ | ◎ |
| | 25 | 0.5 | 0 | 0.1 | 0 | 0 | 0 | 0.1 | 13 | 70 | 31 | ○ | ○ | ◎ |
| | 26 | 0.5 | 0 | 0 | 0.1 | 0 | 0 | 0.1 | 10 | 69 | 31 | ○ | ○ | ◎ |
| | 27 | 0.5 | 0 | 0 | 0 | 0.1 | 0 | 0.1 | 12 | 69 | 30 | ○ | ○ | ◎ |
| | 28 | 0.5 | 0 | 0 | 0 | 0 | 0.1 | 0.1 | 4 | 73 | 33 | ○ | ○ | ◎ |
| | 29 | 0.5 | 0.01 | 0.01 | 0 | 0 | 0 | 0.02 | 12 | 66 | 30 | ○ | ○ | ◎ |
| | 30 | 0.5 | 0.01 | 0 | 0.01 | 0 | 0 | 0.02 | 4 | 71 | 33 | ○ | ○ | ◎ |
| | 31 | 0.5 | 0.01 | 0 | 0 | 0.01 | 0 | 0.02 | 6 | 74 | 32 | ○ | ○ | ◎ |
| | 32 | 0.5 | 0.01 | 0 | 0 | 0 | 0.01 | 0.02 | 9 | 70 | 32 | ○ | ○ | ◎ |
| | 33 | 0.5 | 0.05 | 0.05 | 0 | 0 | 0 | 0.1 | 3 | 71 | 32 | ○ | ○ | ◎ |
| | 34 | 0.5 | 0.05 | 0 | 0.05 | 0 | 0 | 0.1 | 11 | 71 | 32 | ○ | ○ | ◎ |
| | 35 | 0.5 | 0.05 | 0 | 0 | 0.05 | 0 | 0.1 | 5 | 74 | 32 | ○ | ○ | ◎ |
| | 36 | 0.5 | 0.05 | 0 | 0 | 0 | 0.05 | 0.1 | 2 | 77 | 34 | ○ | ○ | ◎ |
| | 37 | 1.0 | 0.01 | 0 | 0 | 0 | 0 | 0.01 | 2.0 | 78 | 34 | ○ | ○ | ○ |
| | 38 | 1.0 | 0 | 0.01 | 0 | 0 | 0 | 0.01 | 1.6 | 76 | 32 | ○ | ○ | ○ |
| | 39 | 1.0 | 0 | 0 | 0.01 | 0 | 0 | 0.01 | 1.7 | 74 | 32 | ○ | ○ | ○ |
| | 40 | 1.0 | 0 | 0 | 0 | 0.01 | 0 | 0.01 | 1.1 | 76 | 32 | ○ | ○ | ○ |
| | 41 | 1.0 | 0 | 0 | 0 | 0 | 0.01 | 0.01 | 1.3 | 77 | 36 | ○ | ○ | ○ |
| | 42 | 1.0 | 0.1 | 0 | 0 | 0 | 0 | 0.1 | 1.4 | 77 | 34 | ○ | ○ | ○ |
| | 43 | 1.0 | 0 | 0.1 | 0 | 0 | 0 | 0.1 | 1.8 | 81 | 36 | ○ | ○ | ○ |
| | 44 | 1.0 | 0 | 0 | 0.1 | 0 | 0 | 0.1 | 1.5 | 81 | 34 | ○ | ○ | ○ |
| | 45 | 1.0 | 0 | 0 | 0 | 0.1 | 0 | 0.1 | 0.9 | 82 | 35 | ○ | ○ | ○ |
| | 46 | 1.0 | 0 | 0 | 0 | 0 | 0.1 | 0.1 | 1.1 | 78 | 34 | ○ | ○ | ○ |
| | 47 | 1.0 | 0.01 | 0.01 | 0 | 0 | 0 | 0.02 | 1.4 | 80 | 34 | ○ | ○ | ○ |
| | 48 | 1.0 | 0.01 | 0 | 0.01 | 0 | 0 | 0.02 | 1.2 | 80 | 37 | ○ | ○ | ○ |
| | 49 | 1.0 | 0.01 | 0 | 0 | 0.01 | 0 | 0.02 | 0.7 | 81 | 34 | ○ | ○ | ○ |
| | 50 | 1.0 | 0.01 | 0 | 0 | 0 | 0.01 | 0.02 | 1.2 | 82 | 36 | ○ | ○ | ○ |
| | 51 | 1.0 | 0.05 | 0.05 | 0 | 0 | 0 | 0.1 | 1.0 | 84 | 37 | ○ | ○ | ○ |
| | 52 | 1.0 | 0.05 | 0 | 0.05 | 0 | 0 | 0.1 | 0.9 | 86 | 38 | ○ | ○ | ○ |
| | 53 | 1.0 | 0.05 | 0 | 0 | 0.05 | 0 | 0.1 | 0.1 | 88 | 38 | ○ | ○ | ○ |
| | 54 | 1.0 | 0.05 | 0 | 0 | 0 | 0.05 | 0.1 | 0.8 | 86 | 38 | ○ | ○ | ○ |

TABLE 2

| | | Component content (% by mass) | | | | | | | Wire properties | | | Performance in use | | |
|---|---|---|---|---|---|---|---|---|---|---|---|---|---|---|
| | | | Second components | | | | | | Crystal grain size | Orientation (111) | Hardness | Bonding | Chip | Reliability |
| | No. | Sc | Y | La | Ce | Pr | Nd | Total | (µm) | (%) | Hv | property | crack | test |
| Comparative Example | 1 | 0.005 | 0 | 0 | 0 | 0 | 0 | 0 | 59 | 63 | 24 | ○ | ○ | X |
| | 2 | 0.005 | 0.05 | 0 | 0 | 0 | 0 | 0.05 | 49 | 56 | 27 | ○ | ○ | X |
| | 3 | 0.005 | 0.15 | 0 | 0 | 0 | 0 | 0.15 | 43 | 55 | 41 | X | X | X |

TABLE 2-continued

| | Component content (% by mass) | | | | | | | Wire properties | | | Performance in use | | |
|---|---|---|---|---|---|---|---|---|---|---|---|---|---|
| | | Second components | | | | | | Crystal grain size | Orientation (111) | Hardness | Bonding | Chip crack | Reliability test |
| No. | Sc | Y | La | Ce | Pr | Nd | Total | (μm) | (%) | Hv | property | | |
| 4 | 0.5 | 0 | 0 | 0 | 0 | 0 | 0 | 9 | 68 | 29 | ○ | ○ | Δ |
| 5 | 0.5 | 0.01 | 0 | 0 | 0 | 0 | 0.01 | 12 | 73 | 30 | ○ | ○ | Δ |
| 6 | 0.5 | 0.15 | 0 | 0 | 0 | 0 | 0.15 | 9 | 71 | 43 | X | X | X |
| 7 | 1.5 | 0 | 0 | 0 | 0 | 0 | 0 | 0.6 | 86 | 45 | X | X | X |
| 8 | 1.5 | 0.01 | 0 | 0 | 0 | 0 | 0.01 | 0.7 | 84 | 41 | X | X | X |
| 9 | 1.5 | 0.05 | 0 | 0 | 0 | 0 | 0.05 | 0.8 | 87 | 42 | X | X | X |
| 10 | 1.5 | 0.15 | 0 | 0 | 0 | 0 | 0.15 | 0.08 | 97 | 46 | X | X | X |

Working Example Nos. 1 to 54 in Table 1 are examples or the present invention. In these examples, a component content of the wire fell within the range of the present invention, all of the average crystal grain size, the area ratio of orientation <111>, and the Vickers hardness of the wire fell within the preferred range of the present invention, and the evaluation results of the bonding property and the chip crack were all "circle". This resulted from the fact that the components defined in the present invention were contained in the wire, the contained elements were enforced to form a solid solution by the solution heat treatment, and recrystallization was moderately proceeded by the thermal refining heat treatment.

In Working Example Nos. 1 to 54, the evaluation results of the reliability of the bonded parts after the high-temperature long-term hysteresis were all "circle" or "double circle". This resulted from the fact that the wire was precipitation-strengthened and the recrystallization temperature thereof was increased to prevent recrystallization from proceeding in the high-temperature long-term hysteresis, because the wire contained the components defined in the present invention and was subjected to the aging heat treatment after bonding to precipitate Sc, Y, La, and the like. Particularly, in Working Example Nos. 19 to 36, the content of Sc fell within the preferred range of the present invention, and the evaluation results of the reliability of the bonded parts were all "circle".

Comparative Example Nos. 1 to 10 in Table 2 are comparative examples.

In Comparative Example Nos. 1 to 3, the content of Sc was less than a lower limit of the present invention, and the evaluation results of the reliability were all "cross". As a result of evaluating inner quality of the wire after the high-temperature long-term hysteresis, the average crystal grain size exceeded 50 μm all of Comparative Examples Nos. 1 to 3. As a reason for that, it is estimated that Sc in the wire was insufficient, mechanical strength was not sufficiently increased even after the aging heat treatment, the recrystallization temperature was also not sufficiently increased, and recrystallization has excessively proceeded in the high-temperature long-term hysteresis. Additionally, in Comparative Example No. 1, the total content of Y, La, and the like was less than a lower limit of the present invention. Furthermore, in Comparative Example No. 3, the total content of Y, La, and the like exceeded the upper limit of the present invention, and the bonding property and the chip crack after bonding were "cross".

In Comparative Example Nos. 4 and 5, the total content of Y, La, and the like was less than the lower limit of the present invention. The evaluation result of the reliability was "triangle" in both of Comparative Example Nos. 4 and 5. As a result of evaluating the inner quality of the wire after the high-temperature long-term hysteresis, the average crystal grain size exceeded 50 μm in both of Comparative Example Nos. 4 and 5. As a reason for that, it is estimated that the total content of Y, La, and the like in the wire was insufficient, mechanical strength was not sufficiently increased even after the aging heat treatment, the recrystallization temperature was also not sufficiently increased, and recrystallization has excessively proceeded in the high-temperature long-term hysteresis.

In Comparative Example No. 6, the total content of Y, La, and the like exceeded the upper limit of the present invention. As a result, the Vickers hardness of the wire was out of a preferred range. The bonding property and the chip crack after bonding were "cross", and the evaluation result of the reliability was "cross".

In Comparative Example Nos. 7 to 9, the content of Sc exceeded the upper limit of the present invention. Additionally, the total content of Y, La, and the like was less than the lower limit of the present invention in Comparative Examples Nose 7 and 8, and the total content of Y, La, and the like exceeded the upper limit of the present invention in Comparative Example No. 10. In all of Comparative Example Nos. 7 to 10, the content of Sc exceeded the upper limit of the present invention, so that the Vickers hardness was out of a preferred upper limit of the present invention. When the content of Sc exceeded the upper limit, Sc failed to sufficiently form a solid solution and was precipitated even when it was enforced to form a solid solution, so that the Vickers hardness was out of the preferred upper limit. In Comparative Example No. 10, the total content of Y, La, and the like also exceeded the upper limit, so that the average crystal grain size was smaller than a preferred lower limit of the present invention, and the area ratio of orientation <111> was out of a preferred upper limit of the present invention. When the content of Sc, Y, La, and the like was out of the upper limit, they also failed to sufficiently form a solid solution and were precipitated, so that the grain size was reduced, and also, orientation <111> was increased. As a result, both of the bonding property and the chip crack were "cross", and the evaluation results of the reliability of the bonded parts after the high-temperature long-term hysteresis were "cross" in all of Comparative Examples Nos, 7 to 10.

The invention claimed is:

1. An Al bonding wire consisting of Sc, at least one of Y, La, Ce, Pr, and Nd, and a balance,
    wherein the Al bonding wire comprises 0.01 to 1% by mass of Sc and further 0.01 to 0.1% by mass in total of at least one or more of Y, La, Ce, Pr and Nd, with the balance comprising 99.99% by mass or more of Al.

2. The Al bonding wire according to claim 1, wherein an average crystal grain size in a cross-section perpendicular to a wire longitudinal direction is 0.1 to 50 μm.

3. The Al bonding wire according to claim 1, wherein in a cross-section perpendicular to a wire longitudinal direction, an area ratio of a crystal having a crystal orientation <111> angled at 15 degrees or less to a wire longitudinal direction is 30 to 90%.

4. The Al bonding wire according to claim 1, wherein the Vickers hardness of the wire falls within a range from Hv20 to 40.

5. The Al bonding wire according to claim 1, wherein a wire diameter is 50 to 600 μm.

* * * * *